(12) United States Patent
Funakubo

(10) Patent No.: US 7,576,472 B2
(45) Date of Patent: Aug. 18, 2009

(54) ULTRASONIC MOTOR

(75) Inventor: Tomoki Funakubo, Tokyo (JP)

(73) Assignee: Olympus Corporation, Tokyo (JP)

( * ) Notice: Subject to any disclaimer, the term of this patent is extended or adjusted under 35 U.S.C. 154(b) by 63 days.

(21) Appl. No.: 11/954,882

(22) Filed: Dec. 12, 2007

(65) Prior Publication Data
US 2008/0150393 A1 Jun. 26, 2008

(30) Foreign Application Priority Data
Dec. 21, 2006 (JP) ............................. 2006-343978

(51) Int. Cl.
*H01L 41/047* (2006.01)
*H01L 41/09* (2006.01)

(52) U.S. Cl. .................... 310/316.01; 310/316.02; 310/323.16; 310/323.21; 310/323.19

(58) Field of Classification Search ..............................
310/316.01–316.02, 317, 323.01–323.19, 310/323.21, 330–332, 334–336; *H01L 41/047, H01L 41/09*
See application file for complete search history.

(56) References Cited

U.S. PATENT DOCUMENTS

| | | | |
|---|---|---|---|
| 5,656,881 A * | 8/1997 | Atsuta ................... | 310/316.01 |
| 5,739,621 A * | 4/1998 | Atsuta et al. ........... | 310/316.02 |
| 6,078,438 A | 6/2000 | Shibata et al. | |
| 6,133,671 A * | 10/2000 | Atsuta et al. ........... | 310/316.01 |
| 6,252,332 B1 * | 6/2001 | Takagi et al. ........... | 310/323.02 |

FOREIGN PATENT DOCUMENTS

JP 11-235062 8/1999

* cited by examiner

*Primary Examiner*—Thomas M Dougherty
*Assistant Examiner*—Karen B Addison
(74) *Attorney, Agent, or Firm*—Scully, Scott, Murphy & Presser, P.C.

(57) ABSTRACT

An ultrasonic motor that is capable of stable driving by preventing uneven rotation of a driven body and maintaining the drive efficiency is provided. The ultrasonic motor includes a plurality of ultrasonic transducers including alternately stacked first piezoelectric elements and second piezoelectric elements, and a control unit for applying the same two-phase driving AC voltages to the plurality of ultrasonic transducers. The ultrasonic motor simultaneously generates longitudinal vibration and flexural vibration at the ultrasonic transducers to generate substantially elliptic vibration at output ends of the ultrasonic transducers and relatively moves the ultrasonic transducers and a driven body in contact with the ultrasonic transducers. The control unit includes a vibration detection circuit that detects the vibrations of the ultrasonic transducers and outputs an average-vibration detection signal, a phase comparator circuit that detects a phase difference between one of the two-phase driving AC voltages applied to the ultrasonic transducers and the average-vibration detection signal, and a frequency control circuit that controls the frequency of the driving AC voltages such that the phase difference detected by the phase comparing part is a predetermined value.

8 Claims, 13 Drawing Sheets

ULTRASONIC MOTOR

BACKGROUND OF THE INVENTION

1. Field of the Invention

The present invention relates to an ultrasonic motor.

This application is based on Japanese Patent Application No. 2006-343978, the content of which is incorporated herein by reference.

2. Description of Related Art

Recently, ultrasonic motors have been drawing attention as a new type of motor replacing electromagnetic motors. Ultrasonic motors have the following advantages over known electromagnetic motors:

1) Ultrasonic motors are capable of high torque without using gears;
2) Ultrasonic motors have holding power when powered off;
3) Ultrasonic motors have high resolution;
4) Ultrasonic motors are quiet; and
5) Ultrasonic motors do not generate magnetic noise and are unaffected by noise.

A known ultrasonic motor is disclosed in, for example, Japanese Unexamined Patent Application, Publication No. HEI-11-235062, as a rotary motor using three transducers formed by bonding a piezoelectric device to an elastic body. According to Japanese Unexamined Patent Application, Publication No. HEI-11-235062, a driving circuit is provided for each transducer to drive each transducer by applying an optimal frequency thereto.

BRIEF SUMMARY OF THE INVENTION

With the rotary motor disclosed in Japanese Unexamined Patent Application, Publication No. HEI-11-235062, when the driving frequencies of the transducers are the same, the driven body rotates smoothly. However, when there is a difference in the driving frequencies, there is a problem in that beating occurs in response to the difference, causing an uneven rotation of the driven body when rotated by a frequency significantly lower than the frequency of the ultrasonic range, for example, a frequency of several tens of Hertz.

The present invention has been conceived in light of the problems described above. Accordingly, it is an object of the present invention to provide an ultrasonic motor that is capable of stable driving by preventing uneven rotation of a driven body and maintaining the driving efficiency.

To solve the above-described problems, the present invention provides the following solutions.

A first aspect of the present invention provides an ultrasonic motor including a plurality of ultrasonic transducers including alternately stacked first piezoelectric elements and second piezoelectric elements; and a control unit for applying the same two-phase driving AC voltages to the plurality of ultrasonic transducers, wherein the ultrasonic motor simultaneously generates longitudinal vibration and flexural vibration at the ultrasonic transducers to generate substantially elliptic vibration at output ends of the ultrasonic transducers and relatively moves the ultrasonic transducers and a driven body in contact with the ultrasonic transducers, and wherein the control unit includes vibration detecting part for detecting the vibrations of the ultrasonic transducers and outputting an average-vibration detection signal, phase comparing part for detecting a phase difference between one of the two-phase driving AC voltages applied to the ultrasonic transducers and the average-vibration detection signal, and frequency controlling part for controlling the frequency of the driving AC voltages such that the phase difference detected by the phase comparing part is a predetermined value.

According to this aspect, since the same two-phase driving AC voltage is applied to the plurality of ultrasonic transducers by the control unit, the driving frequencies of the ultrasonic transducers can be matched. Therefore, beating of the driven body rotated by the substantially elliptic rotation of the output end of the ultrasonic transducers is reduced, and uneven rotation of the driven body is prevented.

According to the above-described aspect, the vibration detecting part detects the vibrations of the ultrasonic transducers and output an average-vibration detection signal of the vibration detection signals proportional to the vibrations of the ultrasonic transducers to the phase comparing part. The phase comparing part compares the average-vibration detection signal with one of the two-phase driving AC voltages applied to the ultrasonic transducers and detects the phase difference therebetween. Then, the frequency controlling part is operated to control the two-phase driving AC voltages applied to the ultrasonic transducers such that the phase difference is set to a predetermined value.

In this way, a driving AC voltage having a frequency suitable for each ultrasonic transducer can be applied thereto. Moreover, by controlling the driving frequency while focusing on the phase difference between the driving AC voltage applied to the ultrasonic transducer and the vibration detection signal proportional to the vibration of the ultrasonic transducer, for example, even when the frequency characteristic changes due to a change in the environmental temperature, the driving frequency can immediately follow the change in the temperature environment.

As a result, in addition to preventing uneven rotation of the driven body, the driving efficiency of the ultrasonic motor can be maintained constant, and the motor can be driven stably.

The vibration detecting part in the first embodiment includes C-phase inner electrodes 56 provided on a transducer 1 (for example, see FIGS. 9 and 10), C-phase inner electrodes 56 provided on a transducer 2, and a vibration detection circuit 66 (see FIG. 16).

A second aspect of the present invention provides an ultrasonic motor including a plurality of ultrasonic transducers including alternately stacked first piezoelectric elements and second piezoelectric elements; and a control unit for applying the same two-phase driving AC voltages to the plurality of ultrasonic transducers, wherein the ultrasonic motor simultaneously generates longitudinal vibration and flexural vibration at the ultrasonic transducers to generate substantially elliptic vibration at output ends of the ultrasonic transducers and relatively moves the ultrasonic transducers and a driven body in contact with the ultrasonic transducers, and wherein the control unit includes vibration detecting part for detecting the vibrations of the ultrasonic transducers and outputting vibration detection signals, phase comparing part for detecting a phase difference between one of the two-phase driving AC voltages applied to the ultrasonic transducers and each of the vibration detection signals, selecting part for selecting the maximum phase difference among the plurality of phase differences detected by the phase comparing part, and frequency controlling part for controlling the frequency of the driving AC voltages such that the phase difference selected by the selecting part is a predetermined value.

According to this aspect, since the same two-phase driving AC voltage is applied to the plurality of ultrasonic transducers by the control unit, the driving frequencies of the ultrasonic transducers can be matched. Therefore, beating of the driven body rotated by the substantially elliptic rotation of the output end of the ultrasonic transducers is reduced, and uneven rotation of the driven body is prevented.

According to the above-described aspect, the vibration detecting part detects the vibrations of the ultrasonic transducers and outputs vibration detection signals proportional to the vibrations of the ultrasonic transducers to the phase comparing part. The phase comparing part compares each vibration detection signal with one of the two-phase driving AC voltages applied to the ultrasonic transducers and detects the phase difference therebetween. Then, the selecting part selects the maximum phase difference among the detected phase differences. The frequency controlling part is operated to control the two-phase driving AC voltages applied to the ultrasonic transducers such that the selected phase difference is set to a predetermined value.

In this way, since the ultrasonic transducers are driven by applying a driving AC voltage of a resonance frequency that is the same as that of the ultrasonic transducer having the maximum phase difference, the driving forces of the ultrasonic transducers are not reduced, and all of the ultrasonic transducers can be efficiently driven. Moreover, by controlling the driving frequency while focusing on the phase difference between the driving AC voltage applied to an ultrasonic transducer and the vibration detection signal proportional to the vibration of the ultrasonic transducer, for example, even when the frequency characteristic changes due to a change in the environmental temperature, the driving frequency can immediately follow the change in the environmental temperature.

As a result, in addition to preventing uneven rotation of the driven body, for example, even when there is a relatively large difference between the resonance frequencies of the ultrasonic transducers, the motor can be driven with a large driving force in a stable manner.

The vibration detecting part in the second embodiment includes C-phase inner electrodes 56 provided on a transducer 1 (for example, see FIGS. 9 and 10), C-phase inner electrodes 56 provided on a transducer 2, and vibration detection circuits 82 and 84 (see FIG. 21).

With the ultrasonic motor according to the first or second aspect, the vibration detection signal may be a longitudinal-vibration detection signal proportional to the longitudinal vibration of each of the ultrasonic transducers or a flexural-vibration detection signal proportional to the flexural vibration of each of the ultrasonic transducers.

A third aspect of the present invention provides a method of driving an ultrasonic motor by applying the same two-phase driving AC voltages to a plurality of ultrasonic transducers including alternately stacked first piezoelectric elements and second piezoelectric elements, simultaneously generating longitudinal vibration and flexural vibration at the ultrasonic transducers, generating substantially elliptic vibration at output ends of the ultrasonic transducers, and relatively moving the ultrasonic transducers and a driven body in contact with the ultrasonic transducers, the method including a vibration detecting stage of detecting the vibrations of the ultrasonic transducers and outputting an average-vibration detection signal; a phase comparing stage of detecting a phase difference between one of the two-phase driving AC voltages applied to the ultrasonic transducers and the average-vibration detection signal; and a frequency controlling stage of controlling the frequency of the driving AC voltages such that the phase difference detected in the phase comparing stage is a predetermined value.

According to this aspect, since the same two-phase driving AC voltage is applied to the plurality of ultrasonic transducers by the control unit, the driving frequencies of the ultrasonic transducers can be matched. Therefore, beating of the driven body rotated by the substantially elliptic rotation of the output end of the ultrasonic transducers is reduced, and uneven rotation of the driven body is prevented.

According to the above-described aspect, the vibrations of the ultrasonic transducers are detected, and an average-vibration detection signal of the vibration detection signals is obtained. Subsequently, the average-vibration detection signal is compared with one of the two-phase driving AC voltages applied to the ultrasonic transducers, and the phase difference therebetween is detected. Then, the two-phase driving AC voltages applied to the ultrasonic transducers are controlled such that the phase difference is set to a predetermined value.

In this way, a driving AC voltage having a frequency suitable for each ultrasonic transducer can be applied. Moreover, by controlling the driving frequency while focusing on the phase difference between the driving AC voltage applied to the ultrasonic transducer and the vibration detection signal proportional to the vibration of the ultrasonic transducer, for example, even when the frequency characteristic changes due to a change in the temperature environment, the driving frequency can immediately follow the change in the temperature environment.

As a result, in addition to preventing uneven rotation of the driven body, the driving efficiency of the ultrasonic motor can be maintained constant, and the motor can be driven stably.

A fourth aspect of the present invention provides a method of driving an ultrasonic motor by applying the same two-phase driving AC voltages to a plurality of ultrasonic transducers including alternately stacked first piezoelectric elements and second piezoelectric elements, simultaneously generating longitudinal vibration and flexural vibration at the ultrasonic transducers, generating substantially elliptic vibration at output ends of the ultrasonic transducers, and relatively moving the ultrasonic transducers and a driven body in contact with the ultrasonic transducers, the method including a vibration detecting stage of detecting the vibrations of the ultrasonic transducers and outputting vibration detection signals; a phase comparing stage of detecting a phase difference between one of the two-phase driving AC voltages applied to the ultrasonic transducers and each of the vibration detection signals; a selecting stage of selecting the maximum phase difference among the plurality of phase differences detected in the phase comparing stage; and a frequency controlling stage of controlling the frequency of the driving AC voltages such that the phase difference selected in the selecting stage is a predetermined value.

According to this aspect, since the same two-phase driving AC voltage is applied to the plurality of ultrasonic transducers by the control unit, the driving frequencies of the ultrasonic transducers can be matched. Therefore, beating of the driven body rotated by the substantially elliptic rotation of the output end of the ultrasonic transducers is reduced, and uneven rotation of the driven body is prevented.

According to the above-described aspect, the vibrations of the ultrasonic transducers are detected, and vibration detection signals are obtained. Subsequently, each vibration detection signal is compared with one of the two-phase driving AC voltages applied to the ultrasonic transducers, and each phase difference therebetween is detected. Then, the maximum phase difference among the detected phase differences is selected, and the frequencies of the two-phase driving AC voltages applied to the ultrasonic transducers are controlled such that the selected phase difference is set to a predetermined value.

In this way, since the ultrasonic transducers are driven by applying a driving AC voltage of a resonance frequency that is the same as that of the ultrasonic transducer having the maximum phase difference, the driving forces of the ultrasonic transducers are not reduced, and all of the ultrasonic transducers can be efficiently driven. Moreover, by controlling the driving frequency while focusing on the phase difference between the driving AC voltage applied to an ultrasonic transducer and the vibration detection signal proportional to the vibration of the ultrasonic transducer, for example, even when the frequency characteristic changes due to a change in the temperature environment, the driving frequency can immediately follow the change in the temperature environment.

As a result, in addition to preventing uneven rotation of the driven body, for example, even when there is a relatively large difference between the resonance frequencies of the ultrasonic transducers, the motor can be driven with a large driving force in a stable manner.

With the method of driving an ultrasonic motor according to the third or fourth aspect, the vibration detection signal may be a longitudinal-vibration detection signal proportional to the longitudinal vibration of each of the ultrasonic transducers or a flexural-vibration detection signal proportional to the flexural vibration of each of the ultrasonic transducers.

According to these aspects, there is an advantage in that, in addition to preventing uneven rotation of the driven body, the driving efficiency of the ultrasonic motor can be maintained constant, and the motor can be driven stably.

DETAILED DESCRIPTION OF THE INVENTION

An ultrasonic motor according to a first embodiment of the present invention will be described below with reference to the drawings.

First Embodiment

Figure 1:
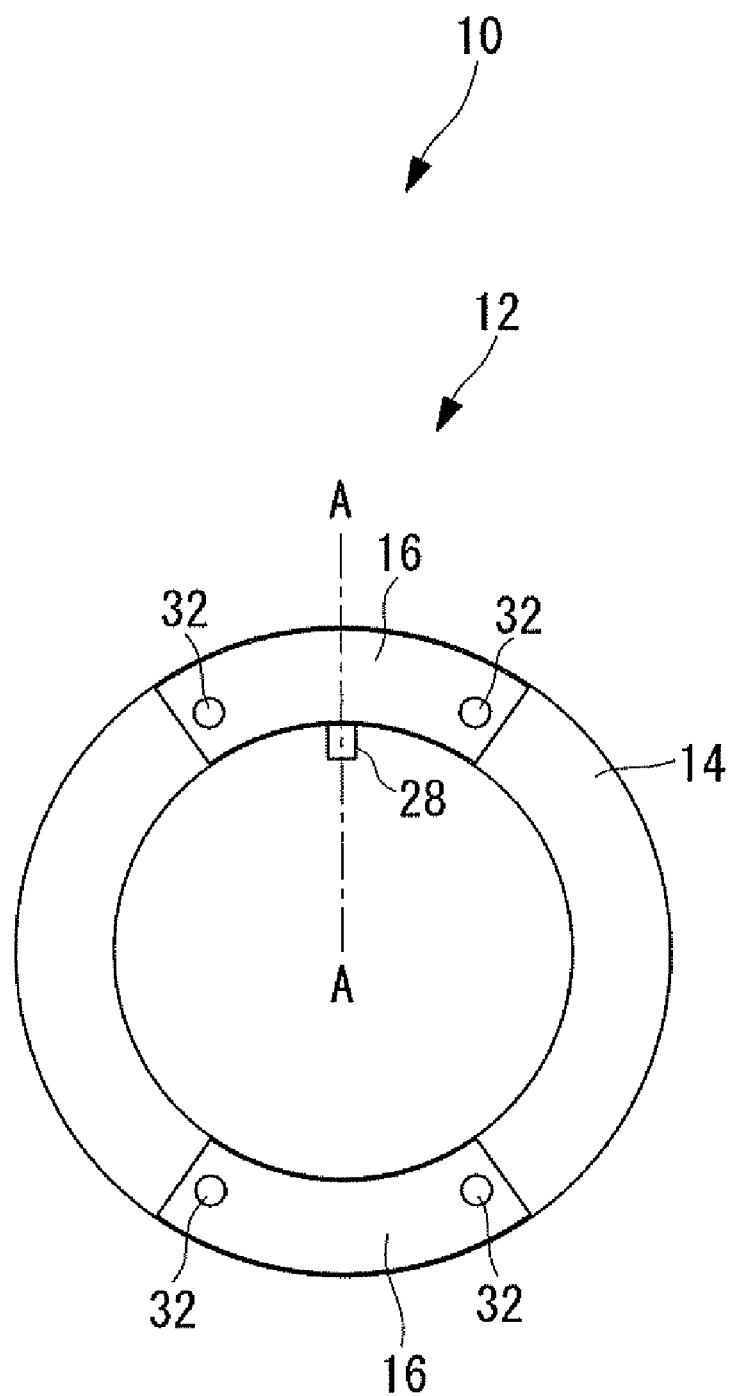
FIG. 1 is a schematic view of an ultrasonic motor according to the present invention.
Figure 2:
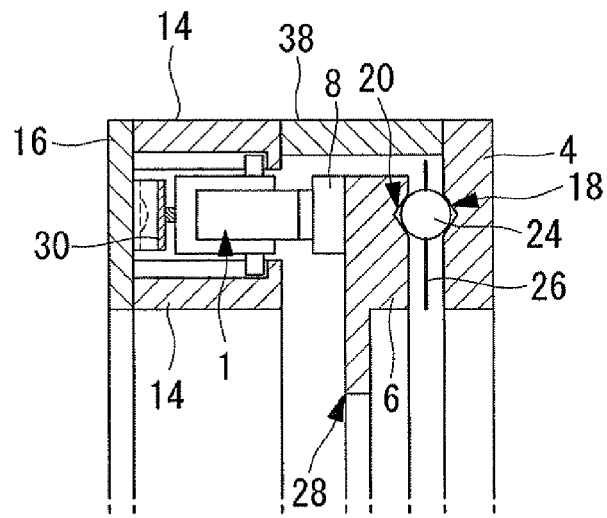
FIG. 2 is a cross-sectional view taken along line A-A in FIG. 1.

FIG. 1 is a plan view of an ultrasonic motor 10 according to this embodiment. FIG. 2 is a cross-sectional view taken along line A-A in FIG. 1.

As shown in FIG. 1, the ultrasonic motor 10 according to this embodiment is an annular rotary motor.

The ultrasonic motor 10 includes a motor mechanism 12 and a control device (control unit) 60, described below (see FIG. 16).

Figure 5:
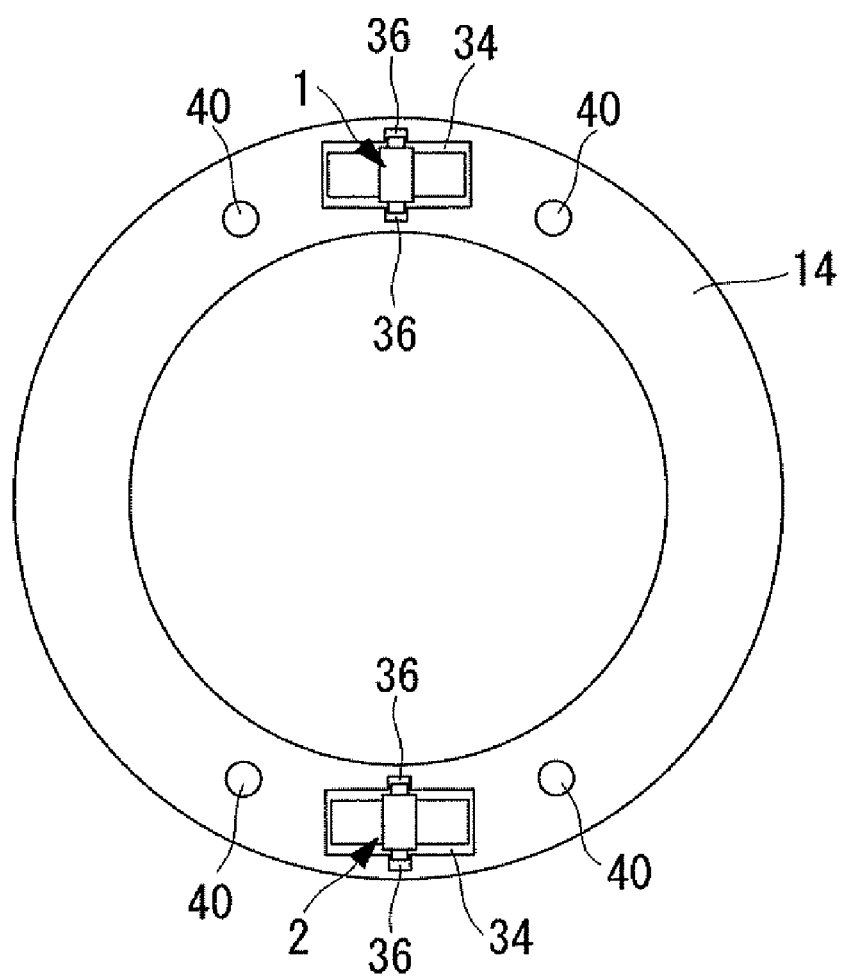
FIG. 5 is a schematic view of the ultrasonic motor according to the present invention wherein the plate-spring supporting member is not provided.

As shown in FIGS. 2 and 5, the above-described motor mechanism 12 includes an annular rotor (driven body) 6 that is supported on an annular base 4 in a freely rotatable manner, transducers (ultrasonic transducers) 1 and 2 that are in contact with slidable members 8 provided on the rotor 6 and that generate a rotational force applied to the rotor 6, an annular cover 14 that supports the transducers 1 and 2, and plate-spring supporting members 16 that push the transducers 1 and 2 attached to the cover 14 against the slidable member 8. The slidable member 8 is made of, for example, alumina ceramic.

Annual V-grooves 18 and 20, facing each other, are provided on opposing surfaces of the base 4 and the rotor 6. A plurality of balls 24 are interposed between the V-grooves 18 and 20 on the base 4 and the rotor 6, with spaces formed therebetween by retainers 26.

An output portion 28 projecting inward in the radial direction is provided at a section of the rotor 6.

The transducers 1 and 2 are provided at two locations with spaces therebetween in the circumferential direction of the cover 14, as shown in FIG. 1.

Figure 3:
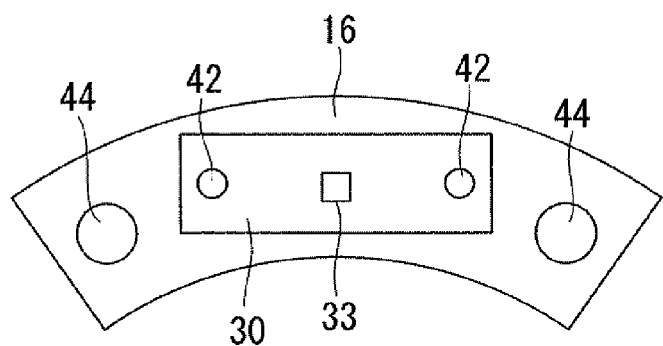
FIG. 3 is a schematic view of the back side of a plate-spring supporting member included in the ultrasonic motor shown in FIG. 1.
Figure 4:
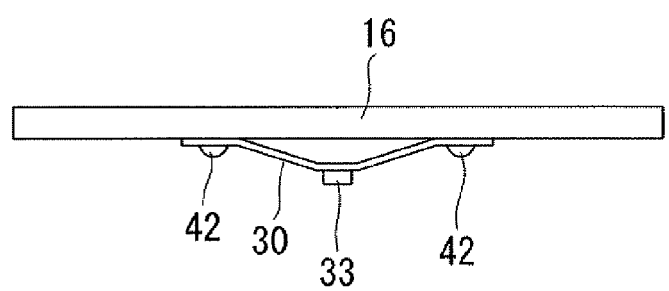
FIG. 4 is a schematic view of a side of the plate-spring supporting member included in the ultrasonic motor shown in FIG. 1.

The plate-spring supporting members 16 each include a plate spring 30 for applying pressure to the transducer 1 or 2 and is fixed to the cover 14 by screws 32 (see FIG. 1). As shown in FIGS. 3 and 4, a projection 33 is provided at the center area of the plate spring 30 to apply pressure to substantially the center of the transducer 1 or 2.

As shown in FIG. 5, concave portions 34 that accommodate the transducers 1 and 2 are formed at two locations in the cover 14 with spaces therebetween in the circumferential direction of the cover 14. The concave portions 34 have depressions 36 that are engaged, in the circumferential direction, with pins 54 fixed to a transducer-supporting member 52, described below (see FIGS. 6 and 7).

In FIG. 2A, reference numeral 38 represents a connecting member for the base 4 and the cover 14; in FIGS. 3 and 4, reference numeral 42 represents screws and reference numeral 44 represents through-holes through which the screws 32 are passed; and in FIG. 5, reference numeral 40 represents threaded holes for the screws 32.

Next, the transducers 1 and 2 will be described in detail.

Figure 6:
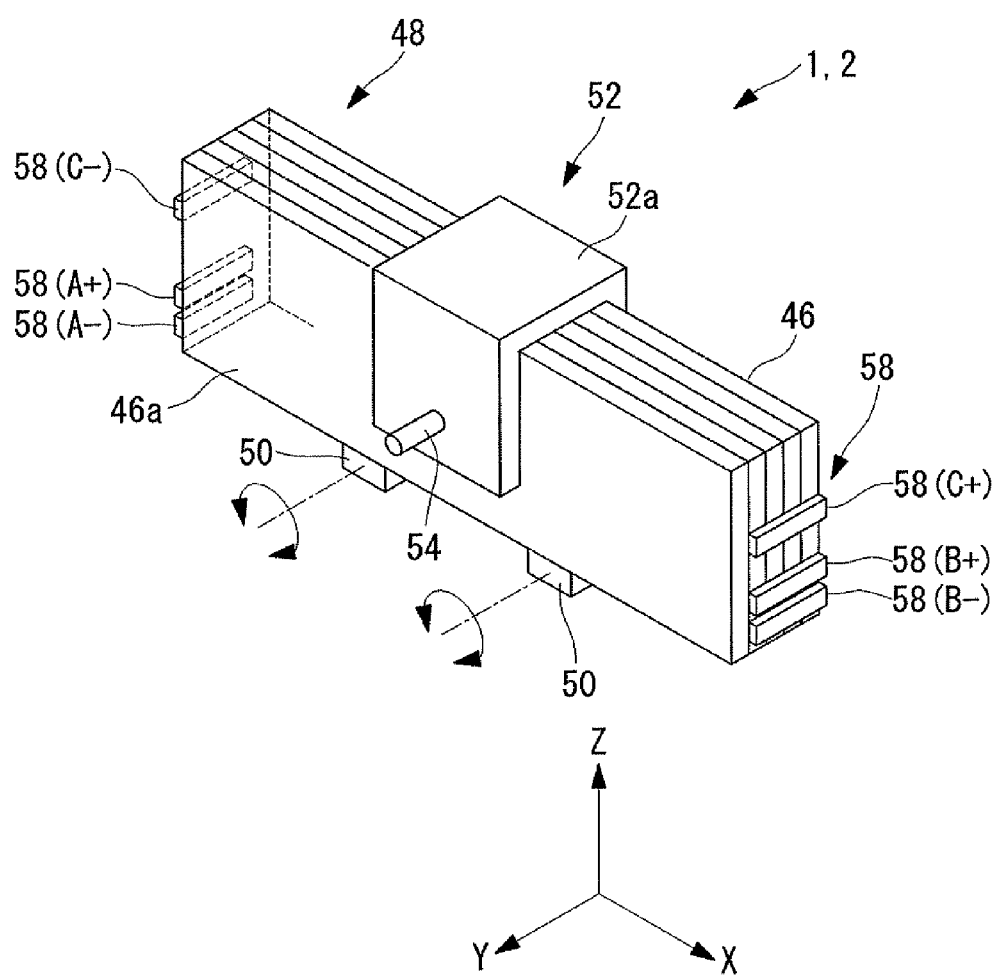
FIG. 6 is a schematic view of an ultrasonic transducer of the ultrasonic motor shown in FIG. 1.

As shown in FIG. 6, the transducers 1 and 2 each include a block-shaped piezoelectric layered body 48 made of a stack of rectangular piezoelectric ceramic sheets (electromechanical converting elements) 46 each having sheets of inner electrodes 56 provided on one side (see FIGS. 9 and 10), two friction-contact terminals 50 (output ends) bonded to one side of the piezoelectric layered body 48, and the transducer-supporting member 52.

Figure 8:
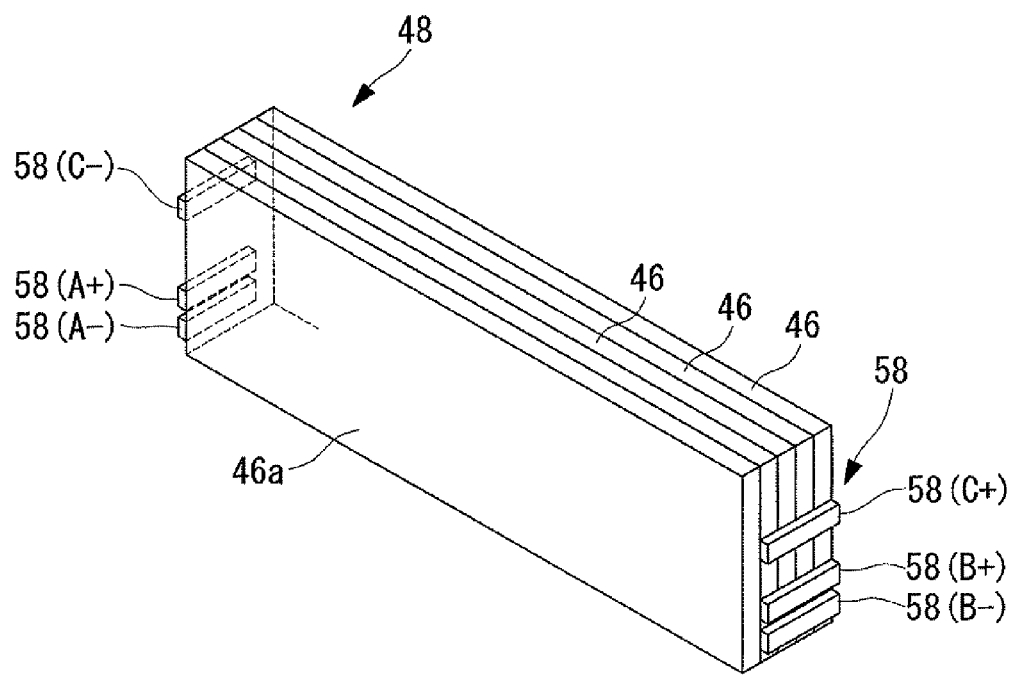
FIG. 8 is a schematic view of a piezoelectric laminated body included in the ultrasonic transducer shown in FIG. 6.

As shown in FIG. 8, the piezoelectric layered body 48, for example, has a length of 20 mm, a width of 5.0 mm, and a thickness of 3.2 mm. The piezoelectric ceramic sheets 46 constituting the piezoelectric layered body 48 are, for example, lead zirconium titanate (hereinafter referred to as "PZT") based piezoelectric ceramic devices having a thickness of about 80 μm. For the PZT, it is preferable to select a hard-type PZT having a large Qm value. The Qm value is approximately 1,800.

Figure 9:
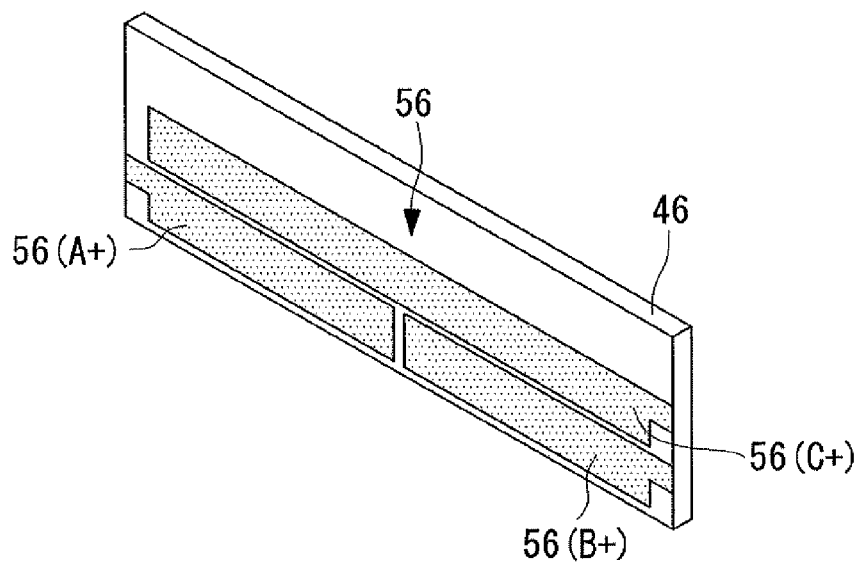
FIG. 9 is a perspective view of a piezoelectric ceramic sheet included in the piezoelectric laminated body shown in FIG. 6.
Figure 10:
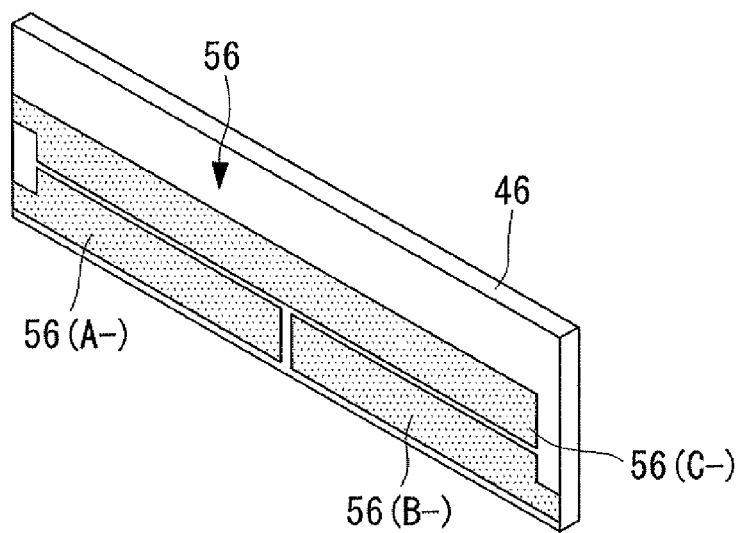
FIG. 10 is a perspective view of the piezoelectric ceramic sheet included in the piezoelectric laminated body shown in FIG. 8.

As shown in FIGS. 9 and 10, the inner electrodes 56 are composed of, for example, a silver-palladium alloy and have a thickness of approximately 4 μm. A piezoelectric ceramic sheet 46a (see FIGS. 6 to 8), which is disposed at one end of the stack, is not provided with the inner electrodes 56. The other piezoelectric ceramic sheets 46 each include two types of inner electrodes 56, as shown in FIGS. 9 and 10.

A piezoelectric ceramic sheet (first piezoelectric device) 46, as shown in FIG. 9, includes inner electrodes 56 (A+) and 56 (B+) for driving and an inner electrode 56 (C+) for vibration detection.

Figure 13:
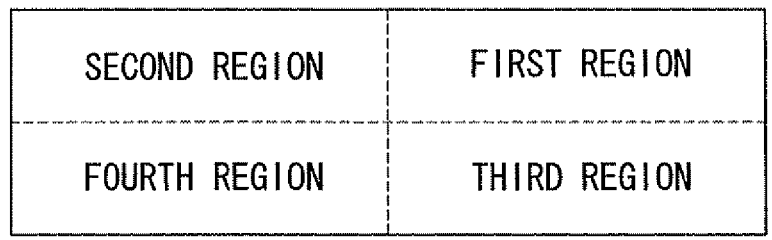
FIG. 13 illustrates the electrical charge generated at inner electrodes provided on the piezoelectric ceramic sheet, which is divided into four regions.

The inner electrode 56 (C+) is provided in the center area in the width direction of the piezoelectric ceramic sheet 46 as a strip extending in the longitudinal direction of the piezoelectric ceramic sheet 46. More specifically, as shown in FIG. 13, the piezoelectric ceramic sheet 46 is divided into four regions, i.e., first to fourth regions, by dividing the piezoelectric ceramic sheet 46 into two in the longitudinal direction and into two in the width direction. The inner electrode 56 (C+) is disposed such that it occupies substantially equal areas in the first to fourth regions.

Instead of the arrangement example described above, the inner electrode 56 (C+) may be disposed such that it occupies substantially equal-sized areas of two predetermined adjoining regions of the four regions and substantially equal-sized areas of the two other adjoining regions. For example, the inner electrode 56 (C+) may be disposed such that it occupies equal-sized areas in the first and second regions and equal-sized areas in the third and fourth regions. In such a case, the sizes of the occupied areas in the first and third regions may differ. The inner electrode 56 (C+) may be disposed over two adjoining regions, instead of over the four regions. For example, the inner electrode 56 (C+) may be disposed over the third and fourth regions such that the sizes of the occupied areas in the third and fourth regions are substantially the same.

The inner electrodes 56 (A+) and 56 (B+) for driving are aligned in the longitudinal direction of the piezoelectric ceramic sheet 46. According to this embodiment, the inner electrode 56 (A+) is disposed in the fourth region shown in FIG. 13, and the inner electrode 56 (B+) is disposed in the third region.

Similarly, the piezoelectric ceramic sheet (second piezoelectric device) 46, as shown in FIG. 10, includes inner electrodes 56 (A−) and 56 (B−) for driving and an inner electrode 56 (C−) for vibration detection.

The inner electrode 56 (C−) on the piezoelectric ceramic sheet 46 shown in FIG. 10 is disposed at a position corresponding to the position of the inner electrode 56 (C+) on the piezoelectric ceramic sheet 46 shown in FIG. 9. Similarly, the inner electrodes 56 (A−) and 56 (B−) are disposed at positions corresponding to the positions of the inner electrodes 56 (A+) and 56 (B+), respectively, as shown in FIG. 9.

The inner electrodes 56 are disposed apart from each other by insulating distances of approximately 0.4 mm in the width direction and the longitudinal direction of the piezoelectric ceramic sheet 46. Parts of the inner electrodes 56 extend to the peripheral edge of the piezoelectric ceramic sheet 46 and connect with external electrodes 58, described below (see FIGS. 6 to 8).

The inner electrodes 56 (C+) and 56 (C−) provided as strips at the center of the piezoelectric ceramic sheet 46 are substantially the same size. The inner electrodes 56 (A+), 56 (B+), 56 (A−) and 56 (B−) are also substantially the same size.

The piezoelectric ceramic sheets 46 shown in FIG. 9 and the piezoelectric ceramic sheets 46 shown in FIG. 10 are alternately stacked to form the block-shaped piezoelectric layered body 48.

The external electrodes 58 that connect to the same type of inner electrodes 56 (A+) to 56 (C−) disposed on the piezoelectric ceramic sheets 46 are provided on the end surfaces in the longitudinal direction of the piezoelectric layered body 48, having the above-described structure.

Figure 7:
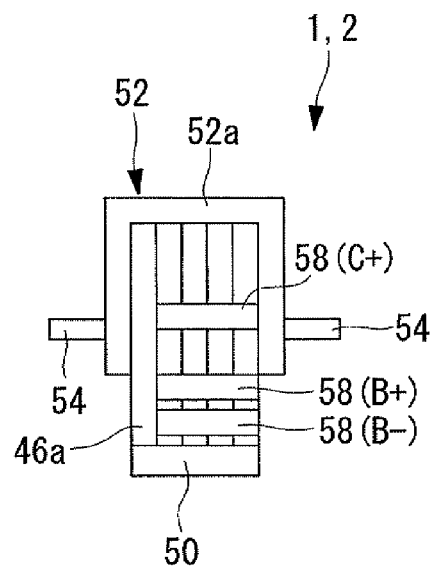
FIG. 7 is a schematic view, from another angle, of the ultrasonic transducer of the ultrasonic motor shown in FIG. 6.

More specifically, as shown in FIGS. 6 to 8, on one end in the longitudinal direction of the piezoelectric layered body 48, a C-phase external electrode 58 (C+) and B-phase external electrodes 58 (B+) and 58 (B−) are provided, in this order, from the other side of the piezoelectric layered body 48 (upper side in the drawing), and on the opposing surface, a C-phase external electrode 58 (C−) and A-phase external electrodes 58 (A+) and 58 (A−) are provided.

The A-phase external electrodes 58 and the B-phase external electrodes 58 are external electrodes for driving, and the C-phase external electrodes 58 are external electrodes for vibration detection. The external electrodes 58 are connected to wiring lines. The wiring lines may be any type of wiring lines that are flexible, such as wiring lines and flexible substrates.

Figure 16:
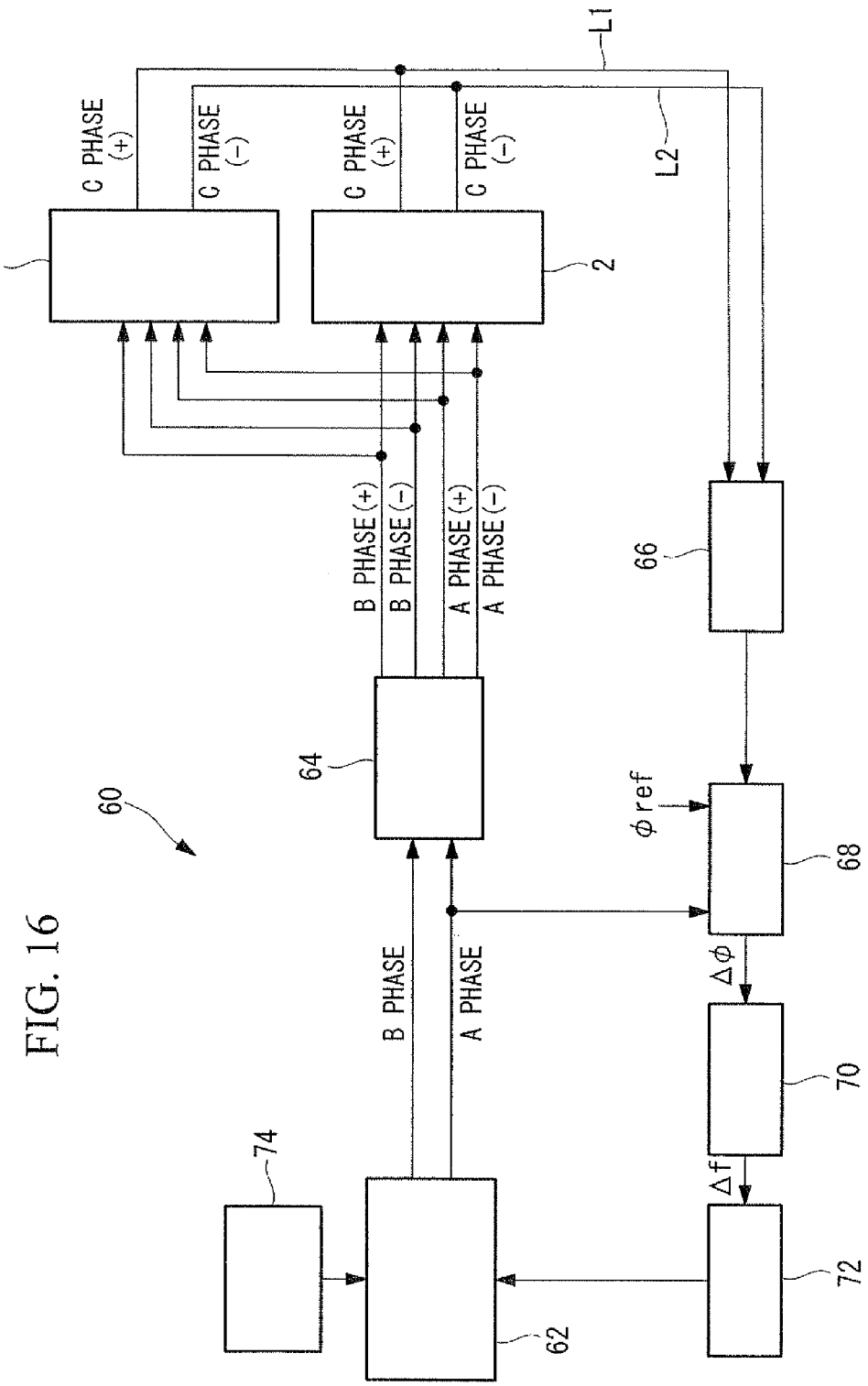
FIG. 16 is a block diagram illustrating, in outline, the structure of a control device according to a first embodiment of the present invention.

More specifically, the pair of wiring lines connected to the A-phase external electrodes 58 (A+) and 58 (A−) and the pair of wiring lines corrected to the B-phase external electrodes 58 (B+) and 58 (B−) are connected to a drive IC 64 of the control device 60 as A-phase and B-phase driving signal lines, as shown in FIG. 16.

As shown in FIG. 16, a pair of wiring lines L1 connected to the C-phase external electrodes 58 (C+) of the transducer 1 and the C-phase external electrodes 58 (C+) of the transducer 2 is connected to a vibration detection circuit 66 of the control device 60.

Similarly, a pair of wiring lines L2 connected to the C-phase external electrodes 58 (C−) of the transducer 1 and the C-phase external electrodes 58 (C−) of the transducer 2 is connected to a vibration detection circuit 66 of the control device 60.

Next, the operation of the piezoelectric layered body 48 having such a structure will be described.

Figure 11:
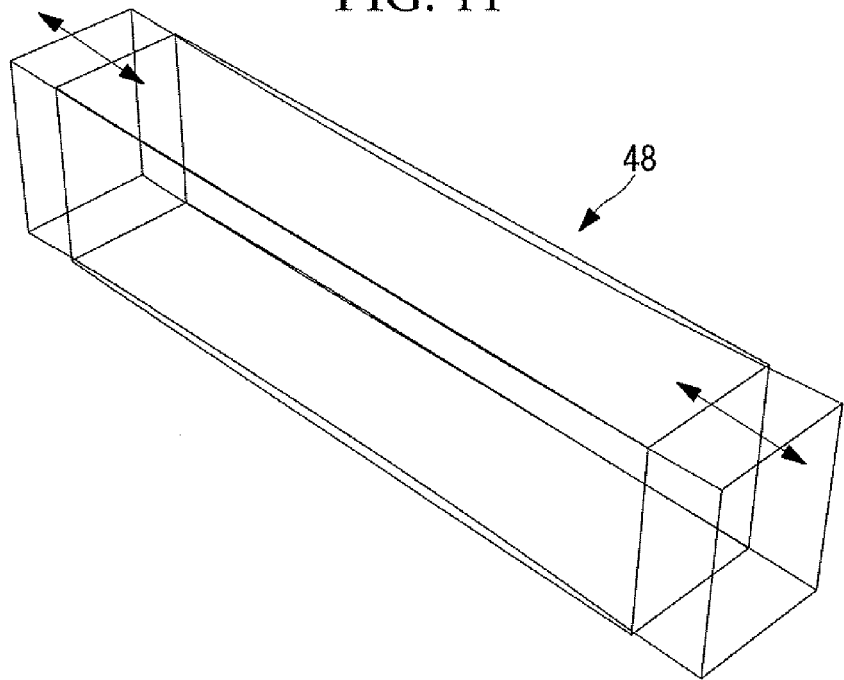
FIG. 11 illustrates a computer analysis of the piezoelectric laminated body shown in FIG. 8 in a first-order longitudinal vibration.
Figure 14:
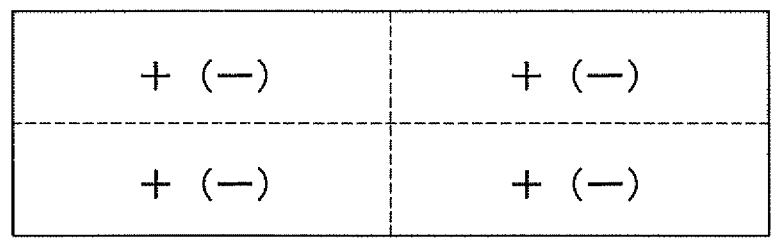
FIG. 14 illustrates the electrical charge excited in each region shown in FIG. 13 when a longitudinal vibration is excited.

By applying driving AC voltages corresponding to the resonance frequency, in the same phase, to the A-phase external electrodes 58 (A+) and 58 (A−) and the B-phase external electrodes 58 (B+) and 58 (B−), a first-order longitudinal vibration is excited, as shown in FIG. 11. At this time, as shown in FIG. 14, positive electric charges or negative electric charges are simultaneously generated in, for example, the first to fourth regions of the above-described piezoelectric ceramic sheets 46, corresponding to the regions when each piezoelectric ceramic sheet 46 is divided into four regions, as shown in FIG. 13.

Figure 12:
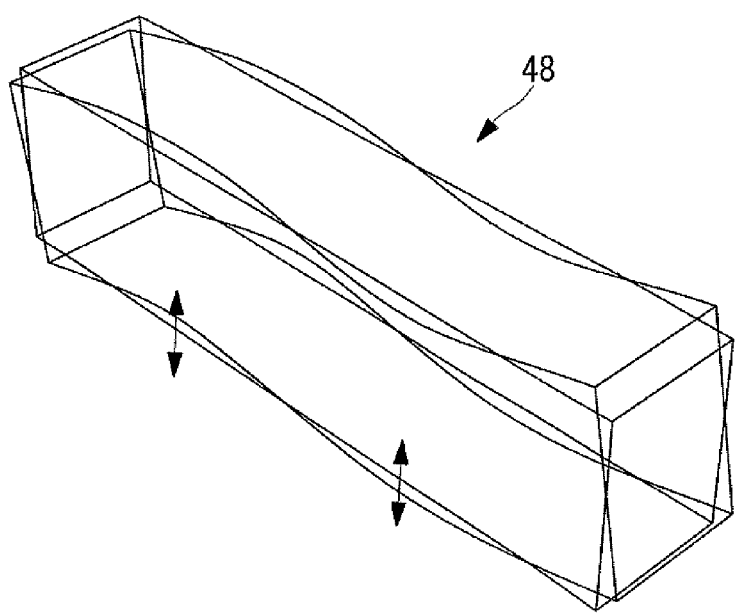
FIG. 12 illustrates a computer analysis of the piezoelectric laminated body shown in FIG. 8 in a second-order flexural vibration.
Figure 15:
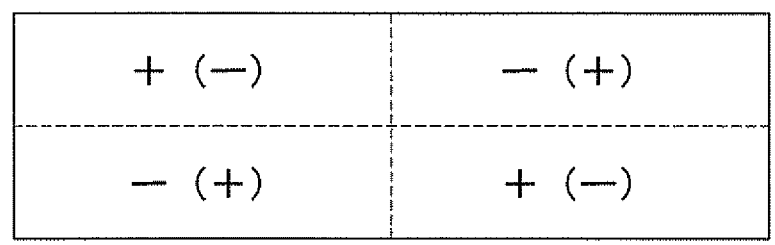
FIG. 15 illustrates the electrical charge excited in each region shown in FIG. 13 when a flexural vibration is excited.

By applying driving AC voltages corresponding to the resonance frequency, in opposite phases, to the A-phase external electrodes 58 (A+) and 58 (A−) and the B-phase external electrodes 58 (B+) and 58 (B−), a second-order flexural vibration is excited, as shown in FIG. 12. At this time, the above-described regions are in charged states as shown in FIG. 15. In other words, when a flexural vibration is excited, electric charges of the same sign are excited in diagonal regions in the first to fourth regions, i.e., in the first and fourth regions or the second and third regions; electric charges of opposite sign are excited in adjoining regions, i.e., in the first and second regions, the second and fourth regions, the third and fourth regions, and the first and third regions.

Electric charges of opposite sign are excited in the inner electrodes 56 (C+) and 56 (C−) that form a pair.

As described above, the electric charges generated by the flexural vibration in the C-phase inner electrodes 56 (C+) and 56 (C−) distributed in equal areas in adjoining regions are cancelled out, and only the electric charges proportional to the longitudinal vibration are excited. Therefore, electric signals detected by the pair of wiring lines L1 of the C-phase external electrode 58 (C+) and the pair of wiring lines L2 of the C-phase external electrode 58 (C−) are proportional to the longitudinal vibration. The sign of the excited electric charge depends on the phase of the vibration.

The piezoelectric layered body 48 is manufactured, for example, as described below.

To manufacture the piezoelectric layered body 48, first the piezoelectric ceramic sheets 46 are prepared. The piezoelectric ceramic sheet 46 are prepared, for example, by casting a slurry mixture of a calcinated powder of PZT and a predetermined binder onto a film (not shown) using a doctor blade method, drying the mixture, and removing the dried mixture from the film. An inner-electrode material is printed using masks having patterns for the inner electrodes 56 on each of the prepared piezoelectric ceramic sheet 46.

Then, first, the piezoelectric ceramic sheet 46a not having an inner electrode 56 is disposed, and then, the piezoelectric ceramic sheets 46 including inner electrodes 56 having different patterns are accurately aligned and alternately stacked, with the inner electrodes 56 facing downward. The stacked piezoelectric ceramic sheets 46 are bonded by thermocompression, cut into a predetermined shape, and fired at a temperature of about 1,200° C. In this way, the piezoelectric layered body 48 is manufactured.

Then, silver is plated onto the inner electrodes 56 exposed at the peripheral edges of the piezoelectric ceramic sheet 46 to form the external electrodes 58 by joining the inner electrodes 56.

Finally, a high-voltage direct current is applied between opposing inner electrodes 56 to polarize and piezoelectrically activate the piezoelectric ceramic sheet 46.

Two friction-contact terminals 50 are bonded on the piezoelectric layered body 48 at positions corresponding to the antinodes of the second-order flexural vibration. In this way, the friction-contact terminals 50 are displaced in the longitudinal direction of the piezoelectric layered body 48 (i.e., X direction in FIG. 6) when a first-order longitudinal vibration is generated at the piezoelectric layered body 48. The friction-contact terminals 50 are displaced in the width direction of the piezoelectric layered body 48 (i.e., Z direction in FIG. 6) when a second-order flexural vibration is generated at the piezoelectric layered body 48.

Consequently, by applying driving AC voltages having different phases and corresponding to the resonant frequencies to the A-phase and B-phase external electrodes 58 of the transducers 1 and 2, the first-order longitudinal vibration and the second-order flexural vibration are generated simultaneously. As a result, vibration in a substantially elliptic motion in a clockwise or counterclockwise direction is generated at the friction-contact terminals 50, as indicated by arrows C in FIG. 6.

The friction-contact terminals 50 are formed of, for example, a material made by mixing potassium titanate fiber, carbon fiber, and PTFE (polytetrafluoroethylene) in PPS resin.

As shown in FIGS. 6 and 7, the transducer-supporting member 52 includes a substantially angular U-shaped supporting portion 52a and the pins 54, which are integrated with the supporting portion 52a and protrude orthogonally from both sides of the supporting portion 52a.

The supporting portion 52a is bonded to the piezoelectric layered body 48 with, for example, silicone resin or epoxy resin, such that the supporting portion 52a surrounds the piezoelectric layered body 48 from one side of the piezoelectric layered body 48 in the width direction. With the supporting portion 52a bonded to the piezoelectric layered body 48, the two pins 54, which are provided on both sides of the supporting portion 52a as integrated members, are disposed coaxially.

The control device 60 of the ultrasonic motor 10 according to this embodiment will be described below with reference to FIGS. 16 to 20.

As shown in FIG. 16, the control device 60 includes a driving-pulse generating circuit 62 that generates a two-phase driving control signal, the drive IC 64 that generates a driving AC voltage on the basis of the driving control signal output from the driving-pulse generating circuit 62, the vibration detection circuit 66 that detects the vibration of the transducers 1 and 2, a phase comparator circuit (phase comparing part) 68 that determines the phase difference of the vibration detection signal output from the vibration detection circuit 66 and the driving control signal generated at the driving-pulse generating circuit 62, a frequency control circuit (frequency controlling part) 70 that controls the driving AC voltage applied to the transducers 1 and 2 depending on the phase difference, a frequency setting circuit 72, and a direction-indicating circuit 74.

Figure 17:
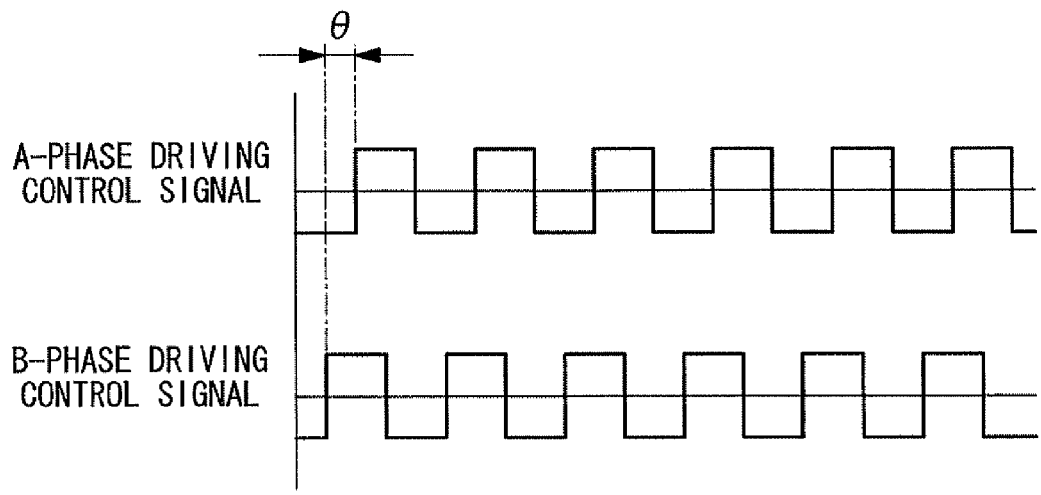
FIG. 17 illustrates a two-phase driving control signal generated at a drive-pulse generator circuit.

As shown in FIG. 17, the driving-pulse generating circuit 62 generates two-phase (A phase and B phase) driving control signals having a predetermined driving frequency and a predetermined phase difference θ and outputs these signals to the drive IC 64. The predetermined phase difference θ is, for example, approximately 90°.

The drive IC 64 generates two-phase (A phase and B phase) driving AC voltages having a predetermined phase difference and a predetermined driving frequency on the basis of the two-phase driving control signals output from the driving-pulse generating circuit 62, and, then, applies these driving AC voltages to the above-described A-phase external electrodes 58 (A+) and 58 (A−) and the B-phase external electrodes 58 (B+) and 58 (B−).

In this embodiment, the two-phase driving AC voltages from the drive IC 64 are input to the external electrodes 58 of the transducer 1 and the external electrodes 58 of the transducer 2, as shown in FIG. 6. For example, a drive IC 64' may be provided for the transducer 1 and a drive IC 64" may be provided for the transducer 2 so that two-phase driving AC voltages are input from the drive IC 64' to the transducer 1 and from the drive IC 64" to the transducer 2.

The vibration detection circuit 66 is connected to the wiring lines L1 connecting the external electrode 58 (C+) of the transducer 1 and the external electrode 58 (C+) of the transducer 2 and to the wiring lines L2 connecting the external electrode 58 (C−) of the transducer 1 and the external electrode 58 (C−) of the transducer 2. The vibration detection circuit 66 detects longitudinal vibrations generated at the transducers 1 and 2 and generates a vibration detection signal proportional to the detected longitudinal vibration.

More specifically, by connecting the C-phase external electrodes 58 of the transducer 1 and the C-phase external electrodes 58 of the transducer 2 in parallel via the wiring lines L1 and the wiring lines L2, an average electric signal of the electric signal of the longitudinal vibration of the transducer 1 and the electric signal of the longitudinal vibration of the transducer 2 is obtained. This average electric signal is input to the vibration detection circuit 66. The vibration detection circuit 66 carries out various types of signal processing, such as level adjustment, noise removal, and digitization, on the electric signal to convert it into a digital signal. Then, the vibration detection circuit 66 outputs the processed digital signal as a vibration detection signal of the average (hereinafter referred to as "average-vibration detection signal").

Figure 18:
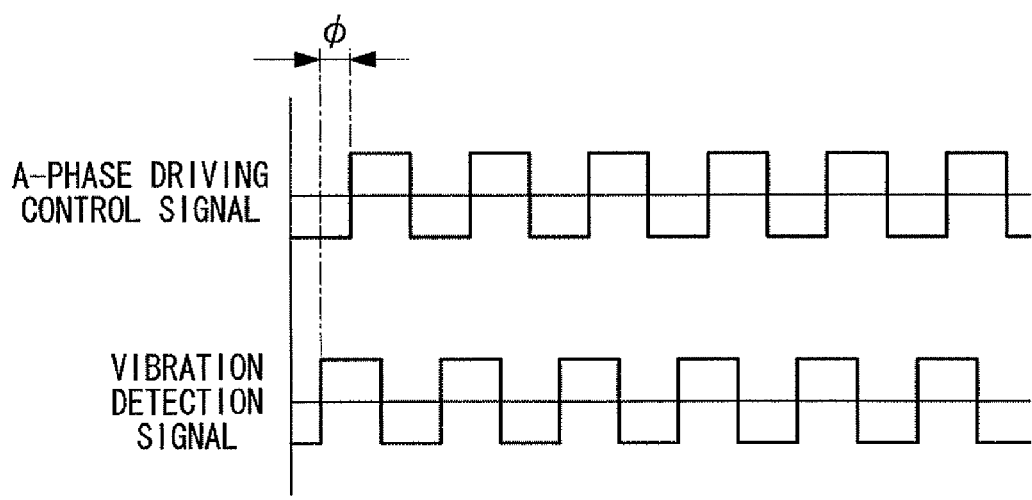
FIG. 18 illustrates a driving control signal in Phase A and a vibration detection signal.

The average-vibration detection signal output from the vibration detection circuit 66 and the A-phase driving control signal input to the drive IC 64 are input to the phase comparator circuit 68. As shown in FIG. 18, the phase comparator circuit 68 determines the phase difference $\phi$ between the A-phase driving control signal and the average-vibration detection signal, determines the difference $\Delta\phi$ between the phase difference $\phi$ and a reference phase difference $\phi\text{ref}$ stored in advance, and outputs a signal according to the difference $\Delta\phi$.

Figure 19:
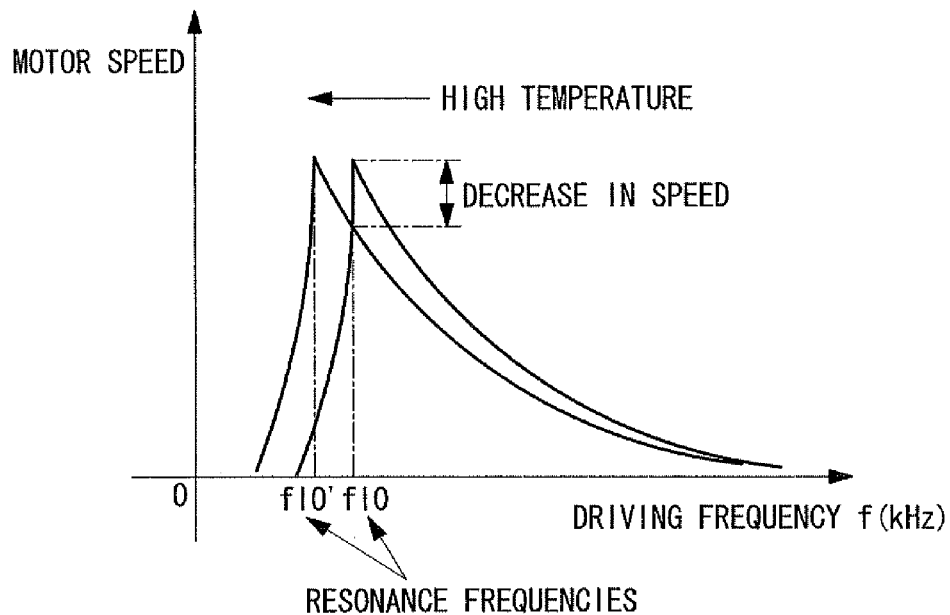
FIG. 19 illustrates the relationship between the driving frequency and the motor speed.

The ultrasonic motor 10 is known to have superior efficiency when driven at the resonance frequency. However, the resonance frequency changes depending on the environmental temperature. More specifically, as shown in FIG. 19, it has a characteristic wherein, when the environmental temperature increases, the resonance frequency decreases (shown in the drawing as the distance between reference numerals f10 and f10'). Therefore, to control the ultrasonic motor 10 so as to obtain the maximum motor speed, the driving frequency must be changed to follow the temperature change.

In FIG. 19, the horizontal axis represents the driving frequency f (kHz) and the vertical axis represents the motor speed.

Figure 20:
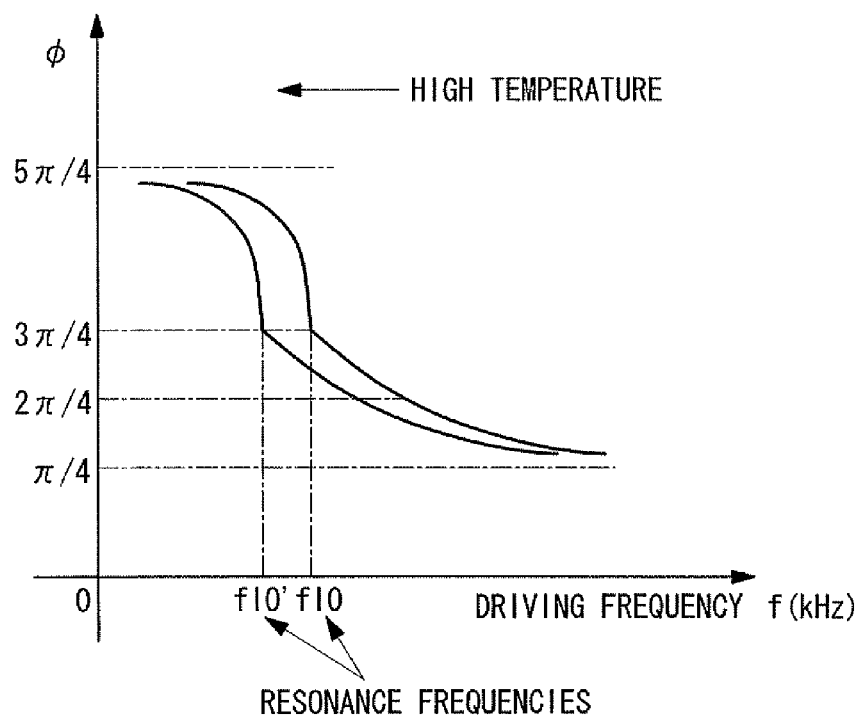
FIG. 20 illustrates the characteristics of the driving frequency and the phase difference.

In contrast, as shown in FIG. 20, there is a relationship between the phase difference $\phi$ of the A-phase driving control signal and the average-vibration detection signal and the resonance frequency wherein even when the resonance frequency changes due to an increase in temperature (shown in the drawing as the distance between reference numerals f10 and f10'), the phase difference $\phi$ is maintained at a constant value.

Accordingly, by controlling the driving frequency at a constant value such that the phase difference $\phi$ between the A-phase driving control signal and the average-vibration detection signal is constant, a constant motor speed can be obtained.

In this embodiment, as described above, the driving frequency is controlled such that the phase difference $\phi$ between the A-phase driving control signal and the average-vibration detection signal is maintained at a constant value.

In FIG. 20, the horizontal axis represents the driving frequency f (kHz) and the vertical axis represents the phase difference $\phi$.

In this embodiment, the reference phase difference $\phi\text{ref}$ is set to $3\pi/4$ and the driving frequency is controlled so that the phase difference $\phi$ between the A-phase driving control signal and the average-vibration detection signal is constantly maintained at the reference phase difference $3\pi/4$. In this way, as shown in FIG. 19, the driving frequency is set at a value corresponding to when the phase difference $\phi$ is $3\pi/4$, and the ultrasonic motor 10 is driven in a range in which maximum efficiency is achieved.

The value of the reference phase difference $\phi\text{ref}$ is not limited to the above-mentioned value and can be set arbitrarily according to the design, depending on the driving efficiency of the ultrasonic motor 10, i.e., the desired motor speed.

As shown in FIG. 16, the difference $\Delta\phi$ from the phase comparator circuit 68 is input to the frequency control circuit 70. The frequency control circuit 70 determines the amount of change $\Delta f$ in frequency for setting the difference $\Delta\phi$ to zero on the basis of the difference $\Delta\phi$ and outputs the amount of change $\Delta f$ in frequency to the frequency setting circuit 72. More specifically, when the difference $\Delta\phi$ is a positive value, an amount of change $+\Delta f$ for increasing the frequency by a predetermined value is output, whereas, when the difference $\Delta\phi$ is a negative value, an amount of change $-\Delta f$ for decreasing the frequency by a predetermined value is output. In this way, in this embodiment, sequential control based on the difference $\Delta\phi$ is carried out.

The amount of change $\Delta f$ from the frequency control circuit 70 is input to the frequency setting circuit 72. The frequency setting circuit 72 includes, for example, an oscillator and a frequency divider circuit. The frequency setting circuit 72 generates a clock signal having a frequency set in accordance with the amount of change $\Delta f$ from the frequency control circuit 70 and outputs the generated clock signal to the above-described driving-pulse generating circuit 62.

A direction-indicating signal from the direction-indicating circuit 74 is input to the driving-pulse generating circuit 62. The driving-pulse generating circuit 62 changes the phase difference $\theta$ of the two-phase driving control signal output to the drive IC 64 in accordance with the direction-indicating signal. In this way, the substantially elliptic vibration generated at the friction-contact terminals 50 of the transducers 1 and 2 can be switched to forward or backward rotation. As a result, the rotational direction of the annular rotor 6, shown in FIG. 2, can be changed to the clockwise or counterclockwise direction.

Next, the operation of the control device 60 will be described.

First, a predetermined driving frequency and a two-phase driving control signal of a predetermined phase difference $\theta$ (=90°) is input from the driving-pulse generating circuit 62 to the drive IC 64. Based on this, two-phase driving AC voltages having a predetermined phase difference and predetermined driving frequencies are applied to the A-phase external electrodes 58 (A+) and 58 (A−) and the B-phase external electrodes 58 (B+) and 58 (B−) of the transducer 1 and the A-phase external electrodes 58 (A+) and 58 (A−) and the B-phase external electrodes 58 (B+) and 58 (B−) of the transducer 2.

In this way, longitudinal vibration and flexural vibration is simultaneously excited in the transducers 1 and 2, a substantially elliptic vibration is generated at the friction-contact terminals 50, and the rotor 6 is rotated by friction generated between the friction-contact terminals 50 and the rotor 6 in the tangential direction of the elliptic vibration (see FIG. 2).

An electric signal corresponding to the longitudinal vibration of the transducers 1 and 2, i.e., an average electric signal of the transducers 1 and 2 according to this embodiment, is input to the vibration detection circuit 66 via the wiring lines L1 and L2. Then, the electric signal is converted into a digital signal at the vibration detection circuit 66 and is input to the phase comparator circuit 68 as an average-vibration detection signal.

The phase difference $\phi$ of the average-vibration detection signal input to the phase comparator circuit 68 and the A-phase driving control signal is determined. Then, by determining the difference $\Delta\phi$ between the phase difference $\phi$ and the reference phase difference $\phi$ref, a signal corresponding to the difference $\Delta\phi$ is output to the frequency control circuit 70.

At the frequency control circuit 70, the sign (plus or minus) of the amount of change $\Delta f$ of frequency is determined on the basis of the sign (plus or minus) of the difference $\Delta\phi$. This amount of change $\Delta f$ is output to the frequency setting circuit 72.

The frequency setting circuit 72 generates a clock signal whose frequency is changed in accordance with the amount of change $\Delta f$ and outputs the generated clock signal to the driving-pulse generating circuit 62.

In this way, feedback control is carried out to set the phase difference $\phi$ between the A-phase driving control signal and the average-vibration detection signal to the reference phase difference $\phi$ref. Accordingly, the ultrasonic motor 10, shown in FIG. 1, can be driven at a desired driving frequency following the temperature change. As a result, the motor can be driven in a constant and stable manner regardless of temperature changes.

As described above, with the ultrasonic motor 10 using the transducers 1 and 2 according to this embodiment, an average electric signal of longitudinal vibrations of the transducers 1 and 2 is detected, two-phase driving control signals are generated on the basis of a phase difference $\phi$ of an A-phase driving control signal and an average-vibration detection signal, and two-phase driving AC voltages based on the two-phase driving control signals are applied to the transducers 1 and 2. Therefore, the transducers 1 and 2 can be driven at the same suitable driving frequency. In this way, beating of the rotor 6 is reduced, and uneven rotation of the rotor 6 is prevented.

Moreover, in this embodiment, the external electrode 58 (C+) of the transducer 1 and the external electrode 58 (C+) of the transducer 2 are connected by the wiring line L1, and the external electrode 58 (C−) of the transducer 1 and the external electrode 58 (C−) of the transducer 2 are connected by the wiring line L2. Then, since the wiring lines L1 and L2 are connected to the input side of the vibration detection circuit 66, the input signal to the vibration detection circuit 66 is an electric signal of the average vibration of the transducers 1 and 2. In this way, the average-vibration detection signal of the transducers 1 and 2 can be easily obtained.

Instead of the above-described structure, the average-vibration detection signal may be obtained by independently detecting the vibrations of the transducers 1 and 2 and determining the average of the vibration detection signals.

According to this embodiment, the A-phase driving control signal and the average-vibration detection signal are compared. However, instead of the A-phase driving control signal, a B-phase driving control signal may be used. In such a case, the reference phase difference $\phi$ref must be changed in accordance with the phase difference $\theta$ between the A-phase driving control signal and the B-phase driving control signal. Furthermore, instead of the two-phase driving control signals, either one of the two-phase driving AC voltages applied from the drive IC 64 to the transducers 1 and 2 may be used.

Second Embodiment

Next, an ultrasonic motor according to a second embodiment of the present invention will be described with reference to FIGS. 21 to 23.

The ultrasonic motor according to this embodiment differs from that according to the above-described first embodiment in that the control device includes a vibration detection circuit and a phase comparator circuit for the transducers and further includes a selector circuit. Hereinafter, in the ultrasonic motor according to this embodiment, parts that have the same structures as those in the ultrasonic motor 10 according to the first embodiment will be represented by the same reference numerals, and descriptions thereof will not be repeated.

Figure 21:
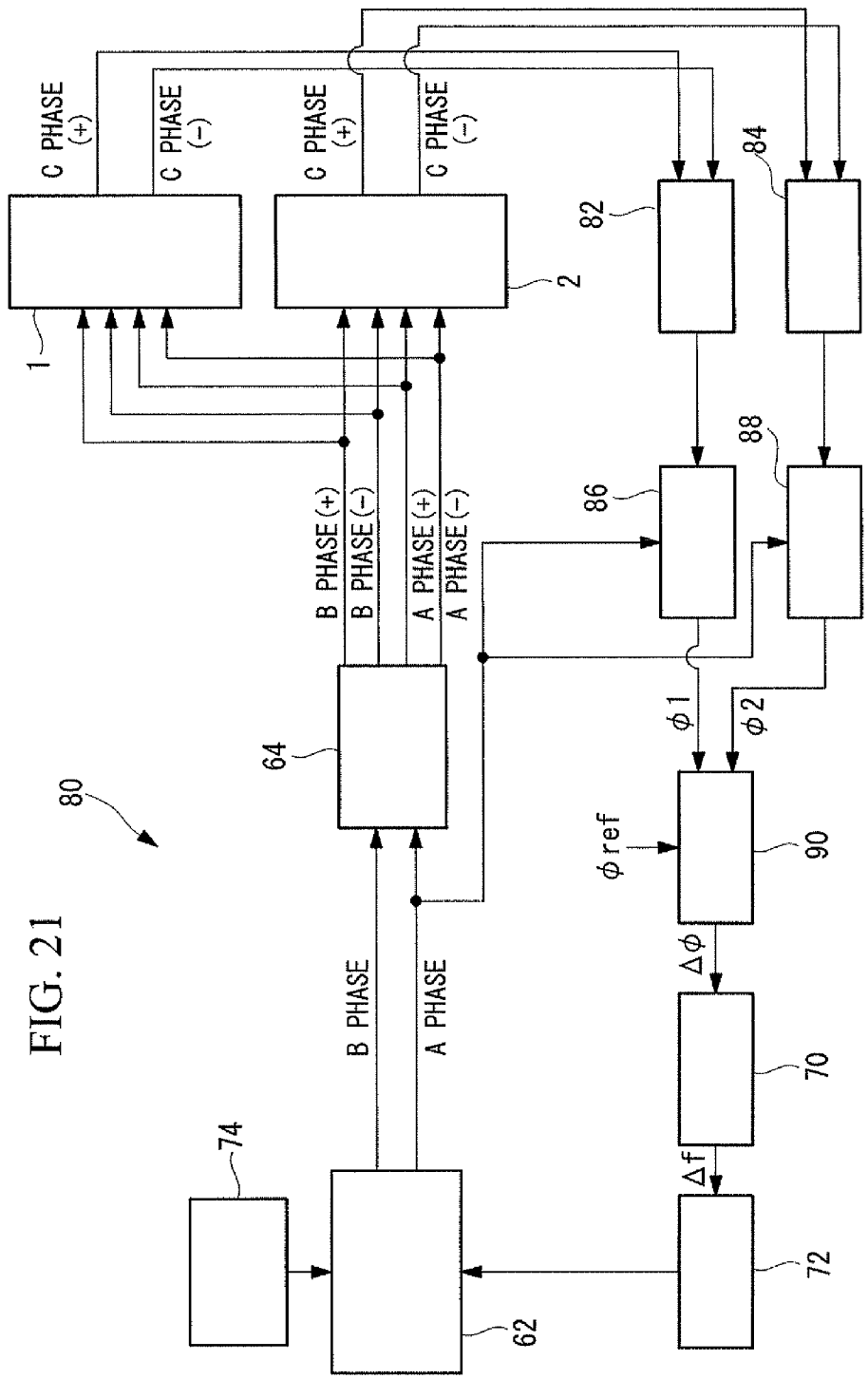
FIG. 21 is a block diagram illustrating, in outline, a control device according to a second embodiment of the present invention.

A control device 80 of the ultrasonic motor according to this embodiment is illustrated in FIG. 21.

The control device 80 includes a vibration detection circuit 82 that detects the vibration of the transducer 1, a vibration detection circuit 84 that detects the vibration of the transducer 2, a phase comparator circuit 86 that detects the phase difference between an A-phase driving control signal and a vibration detection signal output from the vibration detection circuit 82, a phase comparator circuit 88 that detects the phase difference between an A-phase driving control signal and a vibration detection signal output from the vibration detection circuit 84, a selector circuit (selecting part) 90 that selects the maximum phase difference among the phase differences detected by the phase comparator circuits 86 and 88 and outputs the difference $\Delta\phi$ with the reference phase difference $\phi$ref.

With such a structure, the longitudinal vibration of the transducer 1 is detected by the vibration detection circuit 82, and a vibration detection signal is output to the phase comparator circuit 86. The phase comparator circuit 86 determines the phase difference $\phi 1$ between the vibration detection signal and the A-phase driving control signal and outputs the phase difference $\phi 1$ to the selector circuit 90.

Similarly, the longitudinal vibration of the transducer 2 is detected by the vibration detection circuit 84, and a vibration detection signal is output to the phase comparator circuit 88. The phase comparator circuit 88 determines the phase difference $\phi 2$ between the vibration detection signal and the A-phase driving control signal and outputs the phase difference $\phi 2$ to the selector circuit 90.

The selector circuit 90 selects one of the vibration detection signals of the phase differences $\phi 1$ and $\phi 2$, whichever is greater, and outputs the difference $\Delta\phi$ between the selected vibration detection signal and the reference phase difference $\phi$ref to the frequency control circuit 70.

The frequency control circuit 70 controls the driving AC voltages on the basis of the difference $\Delta\phi$ output from the selector circuit 90.

As described above, with the ultrasonic motor according to this embodiment, the frequency of the same driving AC voltage is controlled such that the phase difference between the same two-phase driving control signals applied to the transducers 1 and 2 and one of the vibration detection signals proportional to the vibrations of the transducers 1 and 2, whichever has a greater phase difference between the same two-phase driving control signal, is set at a predetermined value. Therefore, the transducers 1 and 2 are driven efficiently without decreasing the driving force.

In this way, by adjusting the driving frequency on the basis of the greater phase difference, the following advantages are achieved.

Figure 22:
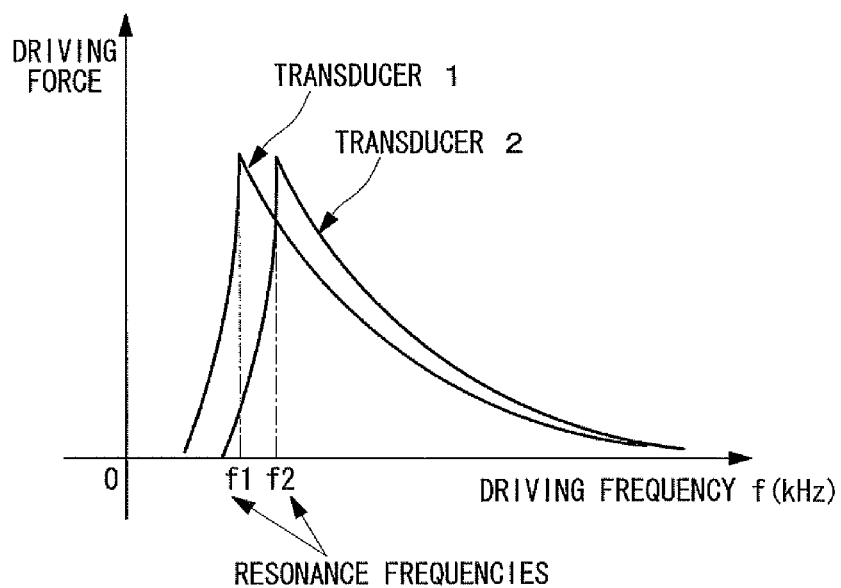
FIG. 22 illustrates the relationship between the driving frequency and the driving force.

FIG. 22 illustrates an example of the relationship between the driving frequencies and the driving forces of the transducers 1 and 2. In this drawing, the horizontal axis represents the driving frequency f (kHz) and the vertical axis represents the driving force. As shown in FIG. 22, for example, when the resonance frequency of the transducer 1 is f1 and the resonance frequency of the transducer 2 is f2 (f2>f1), maximum driving forces are achieved when the transducers 1 and 2 are driven at the resonance frequencies f1 and f2, respectively. When the driving frequency becomes greater than the frequencies f1 and f2, the driving forces gradually decrease, whereas when the driving frequency becomes smaller than the frequencies f1 and f2, the driving forces suddenly decrease.

Therefore, when the driving frequency deviates from the resonance frequency, a decrease in the driving force can be suppressed if the driving frequency becomes greater than the resonance frequency.

According to the first embodiment, the driving frequency is set approximately at the midpoint between the resonance frequencies f1 and f2. For the transducer 1, since the driving frequency is greater than the resonance frequency f1, the driving force does not decrease very much. However, for the transducer 2, the driving frequency is smaller than the resonance frequency f2, and the transducer 2 has to be driven with a small driving force. Consequently, there is a possibility that when both the transducers 1 and 2 are simultaneously operated, the driven force may be decreased. In such a case, the driving force can be maintained and the transducers 1 and 2 can be efficiently driven by setting the driving frequency as close as possible to the resonance frequency f2. In other words, when driving a plurality of transducers, it is preferable to drive the transducers at a driving frequency closest to the resonance frequency of the transducer having the greatest resonance frequency.

Figure 23:
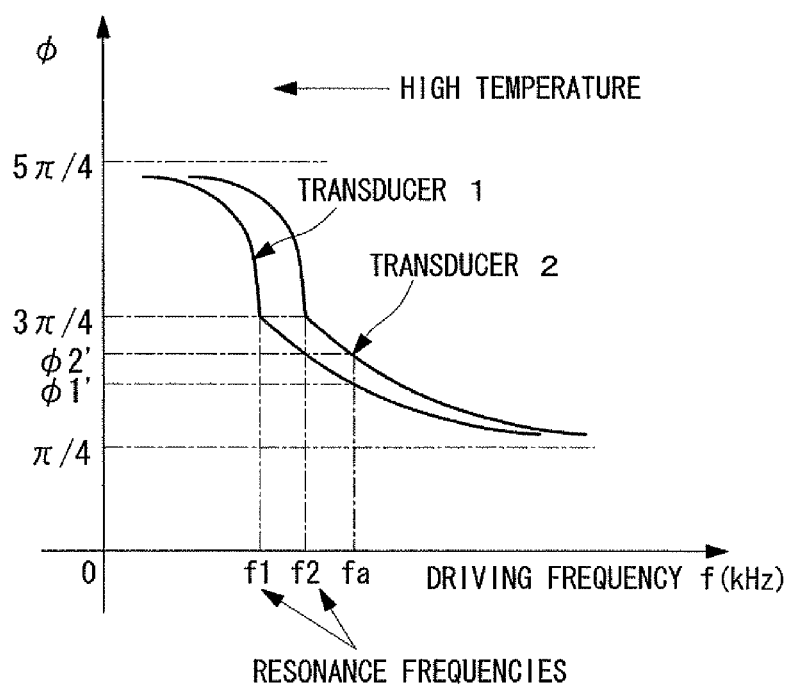
FIG. 23 illustrates a phase difference versus driving frequency characteristic.

FIG. 23 illustrates the relationship between a driving frequency f (kHz) and the phase difference $\phi$ between an A-phase driving control signal and a vibration detection signal. In this drawing, the horizontal axis represents the driving frequency f (kHz) and the vertical axis represents the phase difference $\phi$. As shown in FIG. 23, for example, at a driving frequency fa, the phase difference $\phi 2'$ between the A-phase driving control signal and the vibration detection signal of the transducer 2 is greater than the phase difference $\phi 1'$ between the A-phase driving control signal and the vibration detection signal of the transducer 1. In this way, at the same driving frequency, the phase difference $\phi$ of the transducer 2 having the higher resonance frequency is always greater than the phase difference $\phi$ of the transducer 1 having the lower resonance frequency. Therefore, by selecting the vibration detection signal of the transducer 2 having a great phase difference $\phi$ at the selector circuit 90 and controlling the driving AC voltage by the frequency control circuit 70 on the basis of the difference $\Delta\phi$ between the selected phase difference $\phi$ and the reference phase difference $\phi$ref, the transducers 1 and 2 can be efficiently driven at a driving frequency that is the same as the resonance frequency of the transducer 2.

In the above, the embodiments of the present invention have been described in detail with reference to the drawings. However, specific structures are not limited to those in the embodiments, and modifications may be made within the scope of the invention. For example, in the above-described embodiments, vibration detection signals of longitudinal vibration are used. Instead, however, vibration detection signals of flexural vibration may be used. In such a case, the reference phase difference $\phi$ref must be changed in accordance with the phase difference of the vibration detection signal of longitudinal vibration and the vibration detection signal of flexural vibration (which is 90° in the embodiments).

What is claimed is:

1. An ultrasonic motor comprising:
a plurality of ultrasonic transducers including alternately stacked first piezoelectric elements and second piezoelectric elements; and
a control unit for applying the same two-phase driving AC voltages to the plurality of ultrasonic transducers,
wherein the ultrasonic motor simultaneously generates longitudinal vibration and flexural vibration at the ultrasonic transducers to generate substantially elliptic vibration at output ends of the ultrasonic transducers and relatively moves the ultrasonic transducers and a driven body in contact with the ultrasonic transducers, and
wherein the control unit includes
vibration detecting part for detecting the vibrations of the ultrasonic transducers and outputting an average-vibration detection signal,
phase comparing part for detecting a phase difference between one of the two-phase driving AC voltages applied to the ultrasonic transducers and the average-vibration detection signal, and
frequency controlling part for controlling the frequency of the driving AC voltages such that the phase difference detected by the phase comparing part is a predetermined value.

2. An ultrasonic motor comprising:
a plurality of ultrasonic transducers including alternately stacked first piezoelectric elements and second piezoelectric elements; and
a control unit for applying the same two-phase driving AC voltages to the plurality of ultrasonic transducers,
wherein the ultrasonic motor simultaneously generates longitudinal vibration and flexural vibration at the ultrasonic transducers to generate substantially elliptic vibration at output ends of the ultrasonic transducers and relatively moves the ultrasonic transducers and a driven body in contact with the ultrasonic transducers, and
wherein the control unit includes
vibration detecting part for detecting the vibrations of the ultrasonic transducers and outputting vibration detection signals,
phase comparing part for detecting a phase difference between one of the two-phase driving AC voltages applied to the ultrasonic transducers and each of the vibration detection signals,
selecting part for selecting the maximum phase difference among the plurality of phase differences detected by the phase comparing part, and
frequency controlling part for controlling the frequency of the driving AC voltages such that the phase difference selected by the selecting part is a predetermined value.

3. The ultrasonic motor according to claim 1, wherein the vibration detection signal is a longitudinal-vibration detection signal proportional to the longitudinal vibration of each of the ultrasonic transducers or a flexural-vibration detection signal proportional to the flexural vibration of each of the ultrasonic transducers.

4. The ultrasonic motor according to claim 2, wherein the vibration detection signal is a longitudinal-vibration detection signal proportional to the longitudinal vibration of each of the ultrasonic transducers or a flexural-vibration detection signal proportional to the flexural vibration of each of the ultrasonic transducers.

5. A method of driving an ultrasonic motor by applying the same two-phase driving AC voltages to a plurality of ultrasonic transducers including alternately stacked first piezoelectric elements and second piezoelectric elements, simultaneously generating longitudinal vibration and flexural vibration at the ultrasonic transducers, generating substantially elliptic vibration at output ends of the ultrasonic transducers, and relatively moving the ultrasonic transducers and a driven body in contact with the ultrasonic transducers, the method comprising:
- a vibration detecting stage of detecting the vibrations of the ultrasonic transducers and outputting an average-vibration detection signal;
- a phase comparing stage of detecting a phase difference between one of the two-phase driving AC voltages applied to the ultrasonic transducers and the average-vibration detection signal; and
- a frequency controlling stage of controlling the frequency of the driving AC voltages such that the phase difference detected in the phase comparing stage is a predetermined value.

6. A method of driving an ultrasonic motor by applying the same two-phase driving AC voltages to a plurality of ultrasonic transducers including alternately stacked first piezoelectric elements and second piezoelectric elements, simultaneously generating longitudinal vibration and flexural vibration at the ultrasonic transducers, generating substantially elliptic vibration at output ends of the ultrasonic transducers, and relatively moving the ultrasonic transducers and a driven body in contact with the ultrasonic transducers, the method comprising:
- a vibration detecting stage of detecting the vibrations of the ultrasonic transducers and outputting vibration detection signals;
- a phase comparing stage of detecting a phase difference between one of the two-phase driving AC voltages applied to the ultrasonic transducers and each of the vibration detection signals;
- a selecting stage of selecting the maximum phase difference among the plurality of phase differences detected in the phase comparing stage; and
- a frequency controlling stage of controlling the frequency of the driving AC voltages such that the phase difference selected in the selecting stage is a predetermined value.

7. The method of driving an ultrasonic motor according to claim 5, wherein the vibration detection signal is a longitudinal-vibration detection signal proportional to the longitudinal vibration of each of the ultrasonic transducers or a flexural-vibration detection signal proportional to the flexural vibration of each of the ultrasonic transducers.

8. The method of driving an ultrasonic motor according to claim 6, wherein the vibration detection signal is a longitudinal-vibration detection signal proportional to the longitudinal vibration of each of the ultrasonic transducers or a flexural-vibration detection signal proportional to the flexural vibration of each of the ultrasonic transducers.

* * * * *